United States Patent [19]
Bayston

[11] Patent Number: 5,023,888
[45] Date of Patent: Jun. 11, 1991

[54] PULSE CODE RECOGNITION METHOD AND SYSTEM

[75] Inventor: Thomas E. Bayston, Maitland, Fla.

[73] Assignee: Martin Marietta Corporation, Bethesda, Md.

[21] Appl. No.: 335,015

[22] Filed: Feb. 26, 1973

Related U.S. Application Data

[63] Continuation-in-part of Ser. No. 277,180, Jul. 24, 1972.

[51] Int. Cl.$^5$ .................... H03K 7/04; G01S 13/00; G06F 15/336
[52] U.S. Cl. .................................. 375/23; 342/189; 364/728.03
[58] Field of Search ............ 340/206; 235/150.3, 235/181; 325/143; 343/5 DP, 5 PD, 6.5 LC, 17.1 R, 17.1 PR, 18 E; 244/3.16, 3.13; 356/152; 455/604, 606, 611; 375/23; 342/13, 16, 189; 364/728.03

[56] References Cited

U.S. PATENT DOCUMENTS

| | | | |
|---|---|---|---|
| 2,698,896 | 1/1955 | Rinia | 325/143 |
| 3,167,738 | 1/1965 | Westerfield | 235/181 |
| 3,463,911 | 8/1969 | Dupraz et al. | 235/181 |
| 3,588,898 | 6/1971 | Watters, Jr. et al. | 343/5 DP |
| 3,598,979 | 8/1971 | Moreau | 235/181 |
| 3,614,626 | 10/1971 | Dillard | 343/5 DP |
| 3,702,476 | 11/1972 | Nathanson et al. | 343/5 DP |

Primary Examiner—Stephen C. Ruczinski

[57] ABSTRACT

A system and method for pulse interval modulating signals in accordance with a code wherein the code resides in the spacing between adjacent pulses. The invention has particular utility in connection with laser designators and laser seekers and, while clearly not limited to this application, is disclosed hereinafter mainly in connection with laser designators and seekers. In connection with the laser environment, the system may include a pulse interval modulation encoder for encoding the laser designator output signal and a pulse interval modulation decoder for decoding by the laser seeker of the encoded designator signal. The encoder preferably employs an ordered arrangement of unique pulse interval pairs which cyclically repeats after a relatively long time period. Because of the length of the time period and the apparent randomness of the intervals forming the unique interval pairs, the code appears to enemy countermeasures to be random. The decoder is, however, capable of recognizing the code from a particular designator by locally generating the same ordered set of unique interval pairs for comparison with the incoming designator signal through the use of a digital code correlator having a unique arrangement of shift registers and logic gates. Thus, a number of laser designators may be operated selectively with predetermined seekers in the same area.

29 Claims, 7 Drawing Sheets (DISCRETE INTERVALS)

(CODE 1; ONE CYCLE)

(CODE 2; ONE CYCLE)

(CODE 3; ONE CYCLE)

(CODE 4; ONE CYCLE)

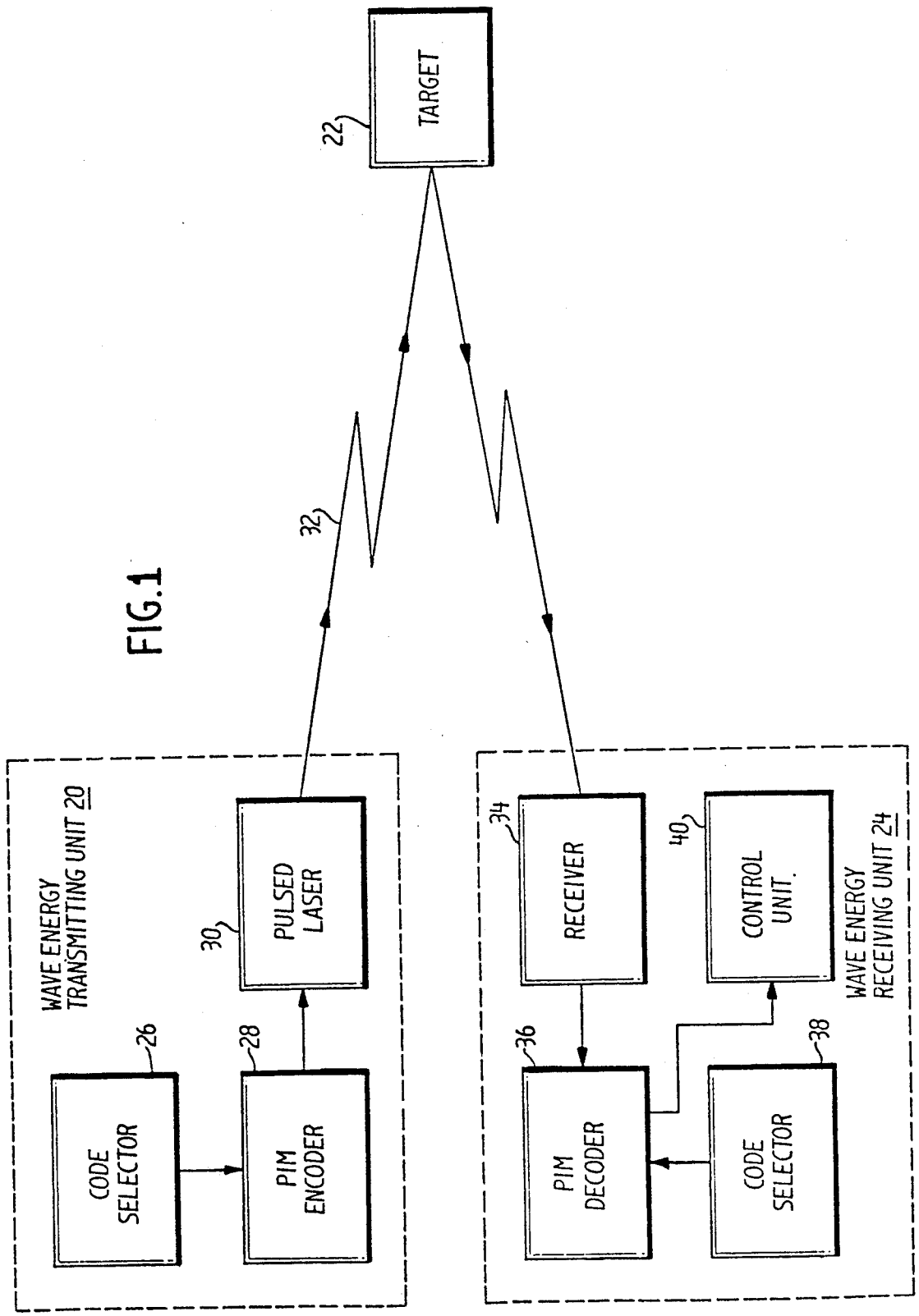

FIG. 2a (DISCRETE INTERVALS)
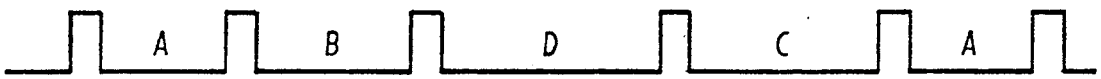
FIG. 2b (CODE 1; ONE CYCLE)
FIG. 2c (CODE 2; ONE CYCLE)
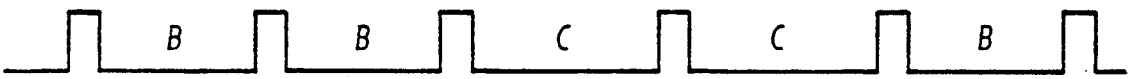
FIG. 2d (CODE 3; ONE CYCLE)
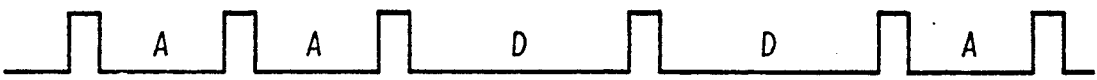
FIG. 2e (CODE 4; ONE CYCLE)

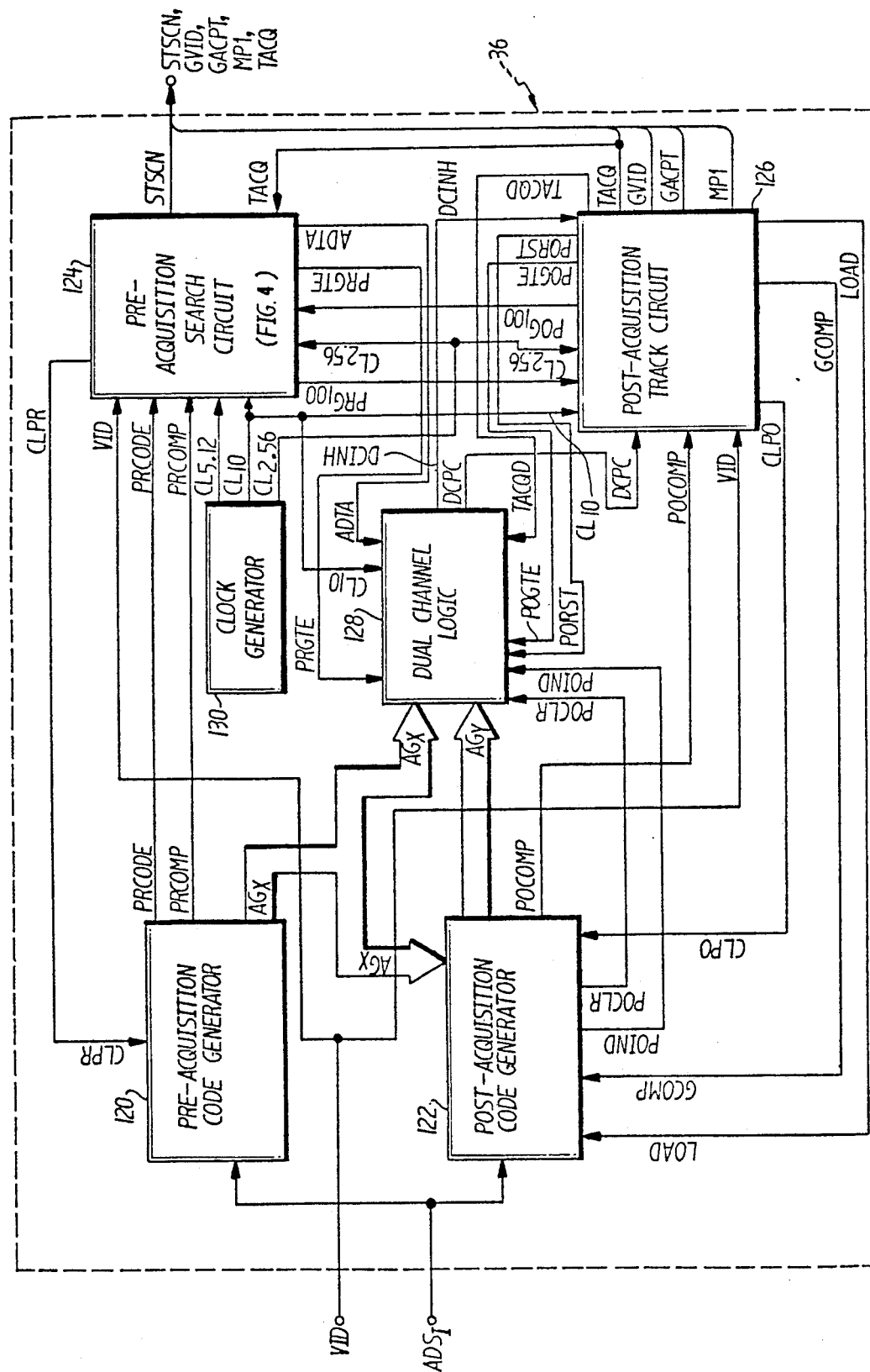
FIG. 3 PIM DECODER

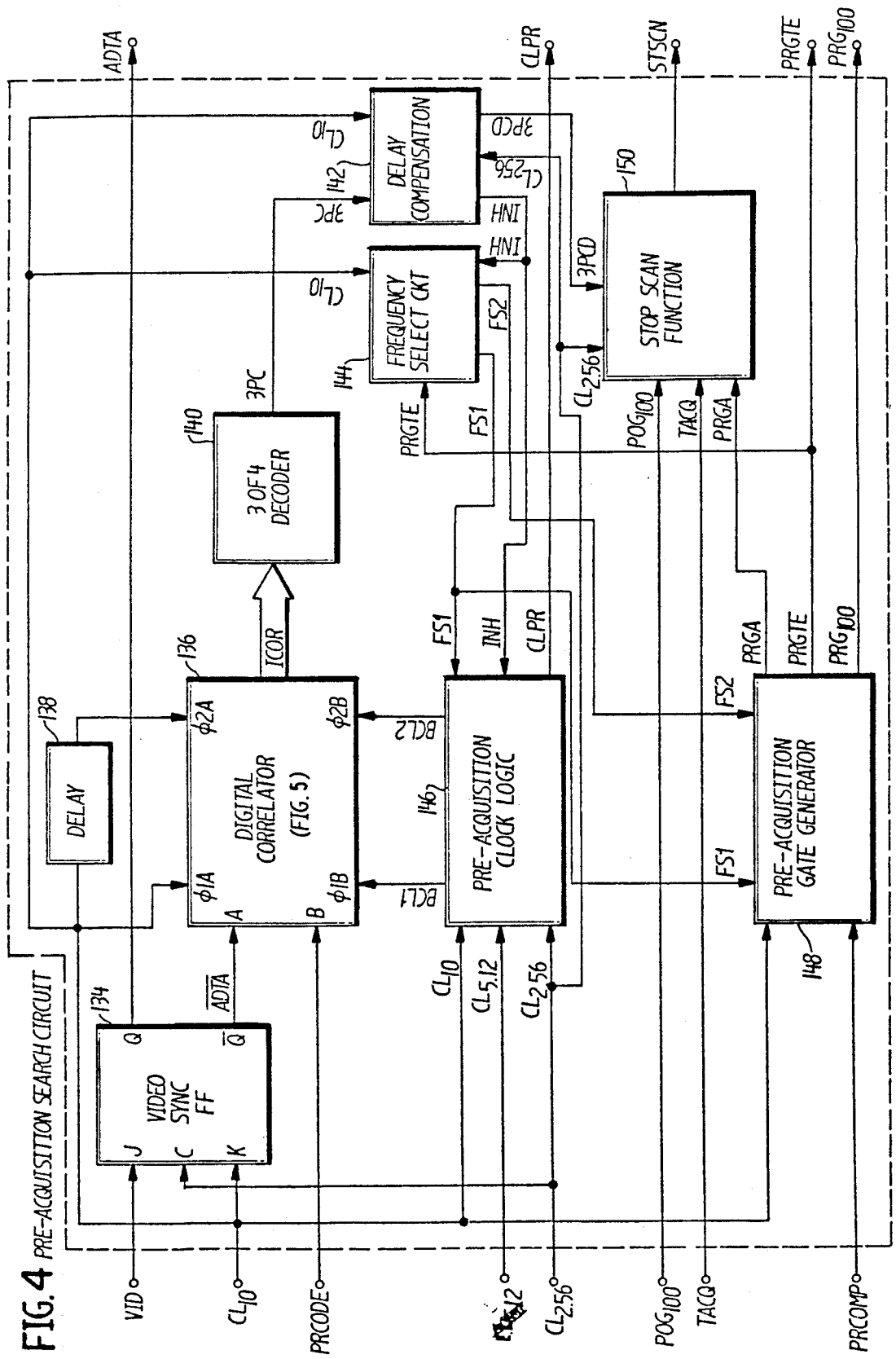
FIG. 4 PRE-ACQUISITION SEARCH CIRCUIT

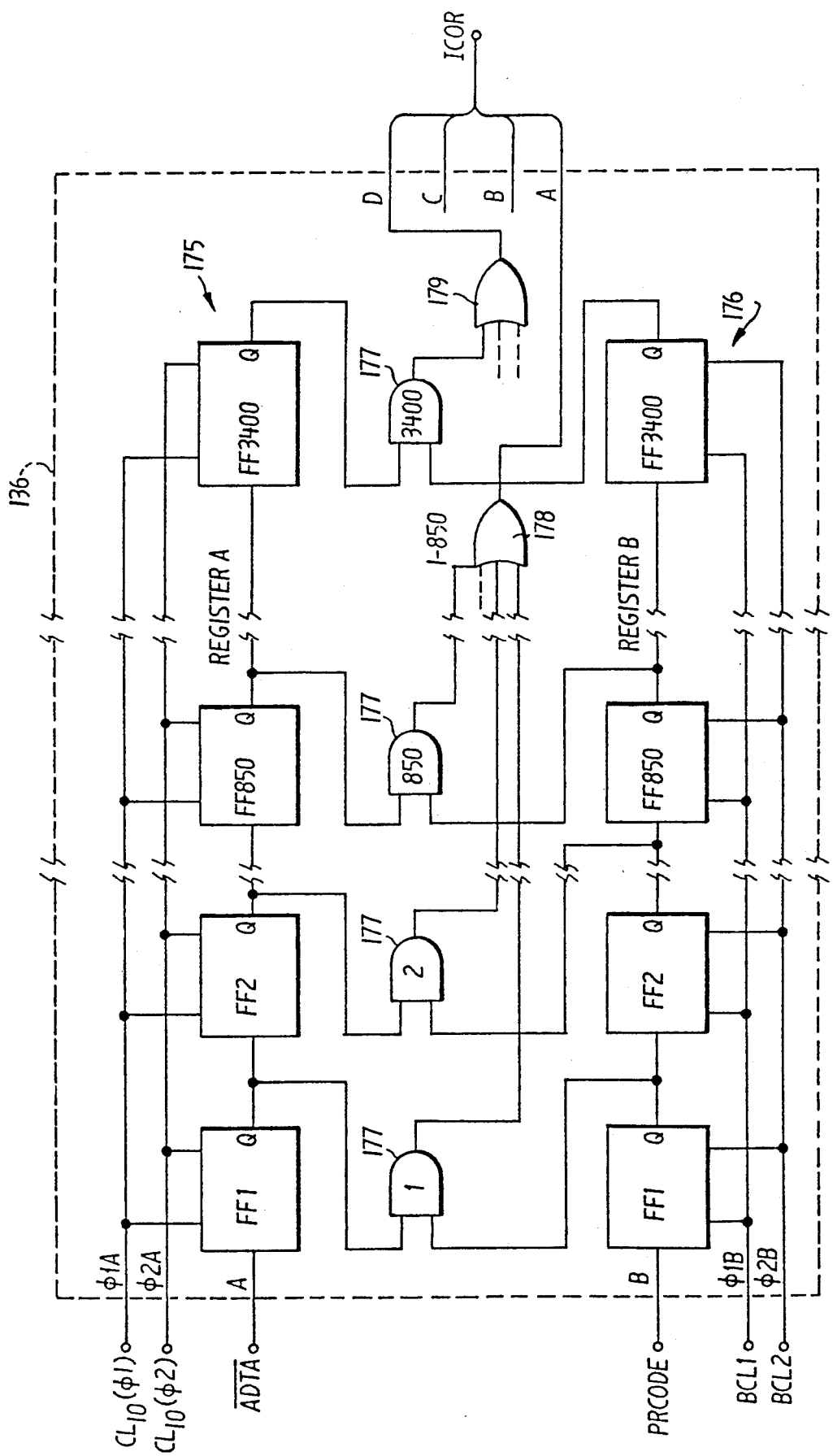
FIG. 5 DIGITAL CORRELATOR

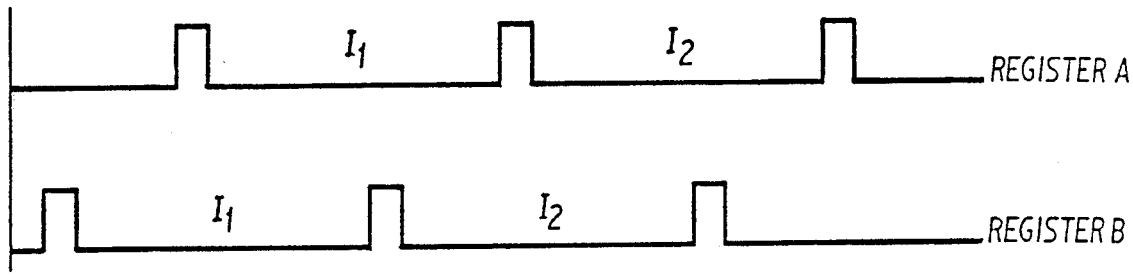
FIG. 6a ($T_1 = 0$)
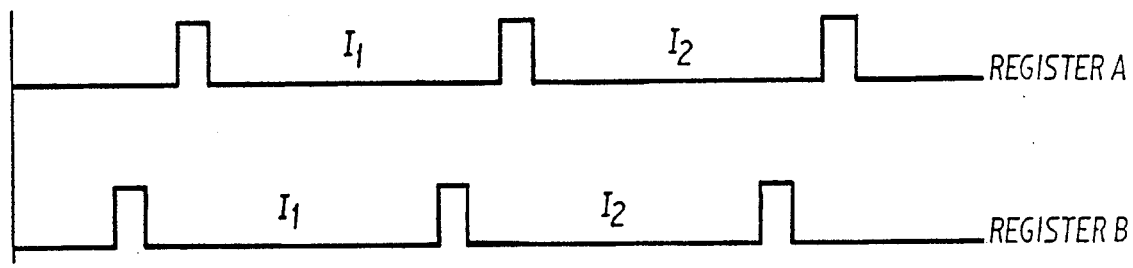
FIG. 6b ($T_2 = T_1 + 10BCL$)
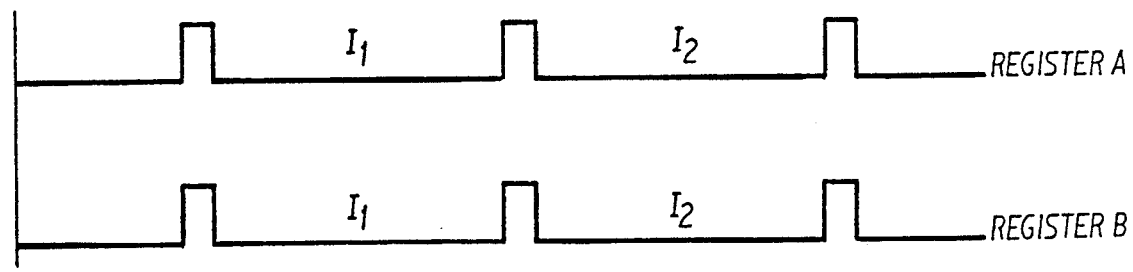
FIG. 6c ($T_3 = T_2 + 10BCL$)

PULSE CODE RECOGNITION METHOD AND SYSTEM

RELATED APPLICATIONS

This application is a continuation-in-part of copending U.S. patent application Ser. No. 277,180, filed July 24, 1972, by Bayston et al for Method and System for Pulse Interval Modulation and assigned to the assignee of the present invention.

BACKGROUND OF THE INVENTION

The present invention relates to a method and system for decoding a pulse interval modulated signal and, in particular, to a method and system for decoding wave energy which is encoded in accordance with selectable pulse interval modulation code sequences. The invention has particular utility in connection with laser designators and seekers and, while clearly not limited to this application, will be described hereinafter in connection with laser designators and seekers to facilitate an understanding thereof.

Laser target designators are used to covertly point out a target for laser seeker equipped aircraft and for the laser designation of targets to provide semiactive guidance of free fall bombs or for the guidance of laser guided missiles. In such a system, pulses of laser energy of high peak power and short duration, e.g., a pulsed solid state laser such as Nd:YAG or Nd:Glass lasing material, are transmitted from the target designator to illuminate a target for tracking or guidance purposes. In an area containing numerous targets, several laser designators may be operating simultaneously and the return energy may cause interference between friendly systems. Thus it becomes necessary for each system operating in one area to be capable of distinguishing the signal from one designator from that of another designator.

In addition, with the proven effectiveness of laser designator systems, it is likely that laser countermeasures will eventually be developed and become a serious threat to their continued success. It is thus of utmost importance that the system be relatively immune to at least those types of countermeasures such as PRF predicters and repeaters which could be presently available.

In the event that the signal transmitted by a laser designator is encoded, the laser seeker receiving the energy must be able to rapidly detect the desired signal in the presence of any interfering signals. This requirement of speed in detecting the desired signal must, of course, be coupled with accuracy to insure reliability of the target seeker or tracking system.

It is accordingly an object of the present invention to provide a novel method and system for rapidly and accurately decoding a pulse interval modulated signal.

It is another object of the present invention to provide a novel digital correlator and method for recognizing any cyclically repetitive predetermined sequence of pulses in a pulse train.

It is a further object of the present invention to provide a novel pulse interval modulation decoding method and system for selectively decoding pulse interval modulation encoded wave energy signals.

It is a more specific object of the present invention to provide a novel pulse interval modulation decoding method and system particularly suited for use in connection with laser target tracking and/or guidance systems.

It is still a further object of the present invention to provide a novel method and system for decoding a pulse signal wherein the intervals between any two adjacent pairs of pulses is unique to a code sequence.

It is yet a further object of the present invention to provide a novel method and decoding system for pulse signals wherein a coded signal can be recognized as being the desired signal upon receipt of only three successive pulses of the signal.

It is still another object of the present invention to provide a novel method and system for dynamically comparing the spacing between pulses of a received signal with the spacing between pulses of a locally generated signal.

It is yet a more specific object of the present invention to provide a novel code correlation circuit constructed entirely from integrated circuits mounted together as a single, integrated package or array.

These and other objects and advantages of the present invention will become apparent to one skilled in the art to which the invention pertains from a perusal of the following detailed description when read in conjunction with the attached drawings.

THE DRAWINGS

FIG. 1 is a broad functional block diagram of a laser system in which the present invention has particular utility;

FIG. 2 is a series of waveforms illustrating the code of the present invention;

FIG. 3 is a general functional block diagram of the PIM decoder of FIG. 1;

FIG. 4 is a functional block diagram of the preacquistion search circuit of FIG. 3;

FIG. 5 is a schematic circuit diagram of a preferred embodiment of the digital correlator of FIG. 4;

FIGS. 6a through 6c are a series of waveforms illustrating the operation of the digital correlator of FIG. 7; and, FIG. 7 is a plan view of a preferred embodiment of the physical layout of the digital correlator of FIG. 5.

THE DETAILED DESCRIPTION

Figure 7:
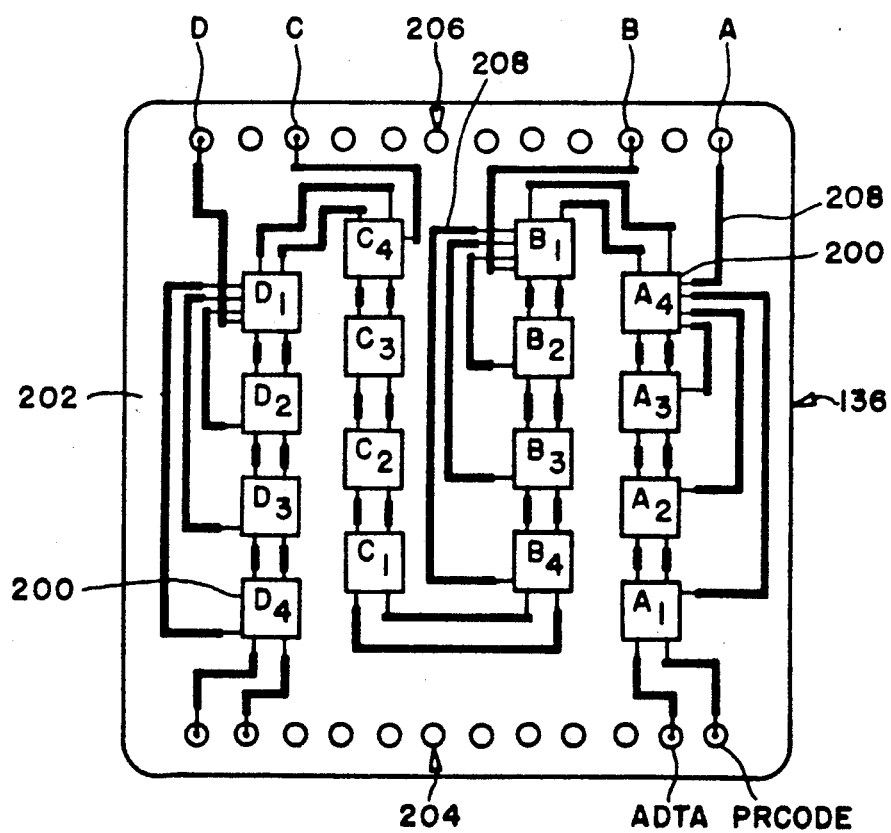

The present invention is hereinafter described in the laser designator and seeker application with which it has particular utility. While it is to be understood that the invention has many other applications and is not to be limited thereto, an understanding of the invention in this laser application may be gained from the following detailed description of a preferred embodiment organized as follows:

Table of Contents

General Systems Description (FIG. 1)
The Code (FIG. 2)
The Decoder (FIGS. 3-7)
    General Description (FIG. 3)
    Pre-Acquisition Search Circuit (FIG. 4)
    Digital Correlator (FIGS. 5-7)

GENERAL SYSTEM DESCRIPTION

The encoding of the wave energy and the rapid and accurate decoding thereof according to the present invention permits a system to operate in the presence of interference by other friendly sources of wave energy or by deliberate electronic countermeasures. The present invention therefore has numerous applications in connection with radar systems, target designation systems and other systems wherein it is desirable to distinguish between a desired signal and an undesired signal. However, since the invention is particularly useful in connection with laser target designation systems, the invention is hereinafter described in this connection to facilitate an understanding thereof.

For example, as is illustrated in FIG. 1, wave energy from a wave energy transmitting unit 20, e.g., light wave energy from a laser target designator may be directed at a target 22 and the reflected energy utilized by a wave energy receiving unit 24 of a weapons system for tracking the target 22 and/or guiding a missile or other projectile to the target 22. In a typical laser target designation system, the transmitting unit may be carried, for example, by a spotter aircraft or ground unit and the missiles or projectiles may be launched from an air or ground unit. The launched missile or projectile may be guided to the target by a suitable guidance system including the wave energy receiver 24.

In the preferred embodiment of the present invention as applied to a laser target designation system, the wave energy transmitting unit 20 may comprise a code selector 26 for selecting a desired pulse interval modulated code (PIM) and a PIM encoder 28 for generating the selected PIM code for application to a suitable pulsed laser 30. The pulses of wave energy spaced in accordance with the selected PIM code (described hereinafter in greater detail) are transmitted from the pulsed laser 30 toward the target 22 along an optical path indicated at 32. These spaced pulses are reflected from the target 22 and received by a suitable light detector or receiver 34 in the wave energy receiving unit 24.

The signal from the receiver 34 in the wave energy receiving unit 24 is then decoded by a PIM decoder 36, the operation of which may be controlled by a code selector 38 as is subsequently described in detail. The desired received signal may then be applied to a control unit 40 for use in controlling a guidance system, for example.

In operation as a laser target designation system for designating targets to a guided missile or projectile weapons system, the wave energy transmitting unit 20 may be a hand-held unit or other portable unit and may be either surface based or air based. A particular PIM code may be assigned to the transmitting unit 20 to distinguish that unit from all other friendly units operating in the area and to permit the recognition of the signal transmitted by the transmitting unit 20 by a particular receiving unit. The transmitting unit 20 thus transmits a pulse laser signal encoded in accordance with a preselected code toward the target 22 to be designated.

The laser energy reflected from the target 22 is received by the receiving unit 24 and decoded thereby. If the code selector 38 of the receiving unit 24 is set to the same code to which the code selector 26 of the transmitting unit 20 is set, the received signal is decoded by the decoder 36 and signals may be supplied to the control unit 40 to provide a control function such as guiding a missile or projectile toward the target 22.

It is thus clear that in an area of multiple targets wherein several laser target designators may be operating simultaneously to designate different targets, different codes may be assigned to each target designator. In a like manner, codes corresponding to the various designator codes may be assigned to the various receiving units within those missiles or projectiles which are to be directed toward the various designated targets. Thus, a designator or transmitting unit may designate a target to a particular receiving unit in the presence of numerous other friendly operating designators. Moreover, as is hereinafter described in greater detail, the receiving unit 24 rejects all but the PIM code selected by the code selector 38 and deliberate electronic countermeasures are ineffective to jam or spoof the receiving unit.

THE CODE

As was previously mentioned in connection with FIG. 1, the transmitted pulses of wave energy are preferably encoded in accordance with a pulse interval modulation (PIM) code. For example, the information or coding carried by the pulses may be carried in the form of the spacing or time intervals between adjacent pulses as is generally described hereinafter and as is described in greater detail in copending U.S. patent application Ser. No. 277,180, filed on July 24, 1972, by Bayston et al and assigned to the assignee of the present invention. The disclosure of the foregoing Bayston et al application is hereby incorporated herein by reference.

With reference now to FIG. 2, a plurality of discrete interpulse intervals, e.g., the four intervals A, B, C and D of FIG. 2a, are arranged in accordance with the present invention to produce the PIM code. By combining the intervals into pairs of intervals, unique ordered pairs of intervals equal in number to the square of the number of discrete interpulse intervals may be provided. This may be represented in accordance with the exemplary discrete intervals A, B, C and D of FIG. 2a as the below tabulated sixteen unique ordered pairs of interpulse intervals:

TABLE I

| AA | BA | CA | DA |
| AB | BB | CB | DB |
| AC | BC | CC | DC |
| AD | BD | CD | DD |

The unique ordered pairs of Table I can then be arranged serially to form various codes. For example, a predetermined number of the unique interval pairs of Table I may be serially combined to form cyclically repetitive sets or code words of a predetermined length, i.e., having a predetermined number of interval pairs. One possible code arrangement utilizing the unique interval pairs of Table I may be that illustrated in FIGS. 2b–2e and shown below as follows:

TABLE II

| Code I.D. | Unique Interval Pairs | Combined Interval Pairs (2 cycles) |
|---|---|---|
| CODE 1: | (AB) (BD) (DC) (CA) | ABDCABDCA ... |
| CODE 2: | (AC) (CD) (DB) (BA) | ACDBACDBA ... |
| CODE 3: | (BB) (BC) (CC) (CB) | BBCCBBCCB ... |
| CODE 4: | (AA) (AD) (DD) (DA) | AADDAADDA ... |

It should be noted that in connection with the above example of Table II, the product of the number of codes and the code lengths (expressed in terms of the number of unique interval pairs in one cycle of the code) is equal to the total number of unique interval pairs available. This arrangement maximizes the use of the available interval pairs in that all interval pairs are used in one of the codes. Another arrangement, for example, might be an arrangement of eight unique interval pairs in each cycle of each code resulting in two unique PIM codes.

In Table II and in FIGS. 2b-2e, it can be seen that two successive, adjacent pulse intervals form unique interval pairs, i.e., pairs which are used only once in each cycle. To facilitate the encoding and decoding of the transmitted pulse signal, the pairs are preferably selected so that the adjacent intervals including the first and last intervals in each cycle are identical, thus permitting the elimination of interval duplication in the final code structure, i.e., the sharing of a common interval between adjacent pulse interval pairs.

It can be seen from the foregoing description of the PIM code of the present invention that through the use of only I discrete interpulse intervals, $I^2$ unique interval pairs are available for forming the PIM code. Thus, with four different available intervals, sixteen unique interval pairs are available to form serial codes.

If the number of unique interval pairs in each cycle of the code is an integer L, the number of available codes C may be expressed by the equation:

$$C = \frac{I^2}{L} \quad (1)$$

Thus, with the four exemplary intervals A, B, C and D forming codes each having four interpulse interval pairs per cycle, four different codes, e.g., Codes 1-4 of Table II, are available.

By making the code length much longer than four interval pairs, each resulting code appears to consist of a plurality of randomly spaced pulses making code duplication almost impossible. However, the spacing between adjacent pulses, i.e., each interval, is unique and known for a particular set of code words, and the spaces between any successive pairs of adjacent pulses, i.e., each interval pair, is unique to a particular word of a particular set. The spacing of the pulses is therefore not random but, since it appears to be random, may be termed "pseudo-random."

Moreover, since all interval pairs are unique within any one cycle or word of any code, only one interval pair at any position in the code need be correctly identified in order to recognize a particular code. Thus, in the exemplary codes of Table II, if the interval pair AA is successfully identified, the received code must be Code 4. A suitable encoder for generating PIM code sequences of the type described above is disclosed and claimed in the previously referenced Bayston et al patent application incorporated herein by reference.

THE DECODER

General Description

The decoder 36 of FIG. 1 permits the wave energy receiving unit 24 to select a properly encoded video signal from the receiver 34 in the presence of interfering signals from other friendly systems and/or electronic countermeasures. As was previously described, the uniqueness of all interval pairs of each code permits the code to be properly recognized upon receipt of three successive pulses, i.e., one interval pair. A preferred embodiment of a decoder for accomplishing this code recognition is described generally herein in connection with FIGS. 3-7 and in greater detail in the referenced Bayston et al application Ser. No. 277,180.

With reference now to FIG. 3, an initial address or $ADS_I$ signal determines the code for which the receiving unit 24 is set. This signal may be applied from the code selector 38 of FIG. 1 to a pre-acquisition code generator 120 and a post-acquisition code generator 122 in the decoder 36. The video signal from the receiver 34 of FIG. 1 may be applied to a pre-acquisition search circuit 124 and to a post-acquisition track circuit 126 in the decoder 36.

A pre-acquisition code or PRCODE signal and a pre-acquisition comparator or PRCOMP signal are applied from the pre-acquisition code generator 120 to the pre-acquisition search circuit 124. A generated pre-acquisition code address or $AG_X$ signal may be applied to the post-acquisition code generator 122 and to a dual channel logic circuit 128.

A post-acquisition comparator or POCOMP signal may be applied from the post-acquisition code generator 122 to the post-acquisition track circuit 126. A generated Y address or $AG_Y$, a post-acquisition counter clear or POCLR signal, and a counter index or POIND signal may be applied from the post-acquisition code generator 122 to the dual channel logic circuit 128.

A suitable conventional clock generator 130 may provide a low frequency clock signal $CL_{10}$, for example a 10 KHz clock signal which may be applied to the pre-acquisition search circuit 124, the post-acquisition track circuit 126, and the dual channel logic 128. The clock generator 130 may also provide a high frequency clock signal $CL_{2.56}$, for example, a 2.56 MHz clock signal, which may be applied to both the pre-acquisition search circuit 124 and the post-acquisition track circuit 126. The clock generator 130 may also provide another high frequency clock signal $CL_{5.12}$, for example, a 5.12 MHz clock signal, which may be applied to the pre-acquisition search circuit 124. The clock signals $CL_{10}$, $CL_{2.56}$ and $CL_{5.12}$ may, alternatively, be supplied from any suitable external clock signal source. The dual channel logic circuit 128 may provide a dual channel inhibit or DCINH signal which may be applied to the post-acquisition track circuit 126.

A 100 microsecond pre-acquisition gate or $PRG_{100}$ output signal may be applied from the pre-acquisition search circuit 124 to the post-acquisition track circuit 126 and a pre-acquisition clock or CLPR output signal may be applied from the pre-acquisition search circuit 124 to the pre-acquisition code generator 120. A pre-acquisition gate or PRGTE output signal and an A register data or ADTA output signal may be applied from the pre-acquisition search circuit 124 to the dual channel logic circuit 128. A stop scan or STSCN output signal from the pre-acquisition search circuit 124 may be provided at a collective output terminal for application to a control unit such as the control unit 40 previously mentioned in connection with FIG. 1.

A 100 microsecond post-acquisition gate or $POG_{100}$ output signal may be applied from the post-acquisition track circuit 126 to the pre-acquisition search circuit 124. A post-acquisition gate or POGTE output signal, a post-acquisition reset or PORST output signal and a delayed track acquisition or TACQD output signal may be applied from the post-acquisition track circuit 126 to the dual channel logic circuit 128. A track acquisition or TACQ output signal may be applied from the post-acquisition track circuit 126 to the pre-acquisition search circuit 124 and may be provided at the collective output terminal of the decoder. A gated video or GVID output signal, a signal accept gate or GACPT output signal and a missing pulse or MP1 output signal may also be applied from the post-acquisition track circuit 126 to the collectively illustrated output terminal of the decoder. A post-acquisition clock or CLPO output signal, a gated post-acquisition comparator or GCOMP output signal and a post-acquisition load or LOAD output signal may be applied from the post-acquisition track circuit 126 to the post-acquisition code generator 122 as is illustrated in FIG. 3.

In operation, the entry of the $ADS_I$ signal from the code selector 38 of FIG. 1 into the pre-acquisition code generator 120 and the post-acquisition code generator 122 may operate to initialize or reset the decoder. Alternatively, a master reset signal may be provided for this purpose if desired. The pre-acquisition code generator 120 locally generates a reference PIM (or PRF) code sequence by a read only memory (ROM) addressing technique in the same manner in which the encoder 28 described in detail in the referenced Bayston et al application generates a selected code sequence. However, when the decoder 36 is in pre-acquisition mode, the locally generated code or PRCODE signal is generated in response to the pre-acquisition clock signal CLPR from the pre-acquisition search circuit 124 and is generated at a rate which greatly exceeds the repetition rate of the incoming video signal.

The incoming video or VID signal applied to the pre-acquisition search circuit 124 is clocked or shifted into a digital code correlator according to the present invention in the pre-acquisition search circuit 124 at approximately a 10 KHz rate as is hereinafter described in greater detail. The code correlator is of sufficient length to insure that at least two complete intervals, i.e., a complete interval pair defined by three successive pulses, are always available for comparison with the locally generated code sequence.

The locally generated code or PRCODE signal is clocked through the digital code correlator in the pre-acquisition search circuit 124 at a much higher rate so that the interval pair of the incoming video signal in the code correlator is compared to every interval pair in the desired code sequence, i.e., one complete code word of the PRCODE signal, before the video signal interval pair is shifted out of the code correlator. This shifting of the video signal through the code correlator at one rate and the shifting of the locally generated code signal through the code correlator at another rate continues until coincidence is detected between three pulses of the video signal and the locally generated code. Three pulse coincidence indicates recognition of a unique interval pair in the incoming video signal which corresponds to a unique interval pair in the locally generated code.

When an interval pair of the incoming video signal matches an interval pair of the locally generated desired code sequence, a stop scan or STSCN signal is generated by the pre-acquisition search circuit 124 for use by the control unit 40 of FIG. 1. For example, this stop scan signal may be utilized by the control unit 40 of a laser seeker system to stop the scanning pattern of the system.

In addition, the pre-acquisition clock signal CLPR which determines the rate of the locally generated code PRCODE is changed from the high clock rate of 2.56 MHz to the lower 10 KHz clock rate at which the video signal is shifted through the code correlator. The locally generated code is thus thereafter generated and shifted through the code correlator in the pre-acquisition search circuit 124 at the same rate at which the incoming video signal is shifted through the code correlator.

The pre-acquisition search circuit 124 searches for the next successive time interval in the incoming video signal and, if this third time interval is present, a track acquisition or TACQ signal is generated to place the system in track and the post-acquisition code generator 122 is synchronized with the pre-acquisition code generator 120. This synchronization of the code generators is accomplished by loading the address $AG_X$ from the pre-acquisition cide generator into the post-acquisition code generator 122 in response to the LOAD signal from the post-acquisition track circuit 126.

Thereafter, the post-acquisition clock signal CLPO effects the generation of the comparator or POCOMP signal which is modulated in accordance with the desired code sequence. This POCOMP signal is utilized by the post-acquisition track circuit 126 to gate the pulses of the video signal VID to the collective output terminal of the decoder as the gated video or GVID signal.

After the decoder has been placed into the post-acquisition or track mode in response to the successful recognition of the desired code sequence, the pre-acquisition code generator and the pre-acquisition search circuit revert to pre-acquisiton mode and continue to correlate the incoming video signal with the locally generated code as was previously described. The decoder is thus in dual channel mode in that it is operating in both pre-acquisition and post-acquisition modes simultaneously.

Each time the pre-acquisition search circuit successfully recognizes an interval pair of the desired code sequence subsequent to the initial three pulse coincidence, the address signal $AG_X$ and $AG_Y$ in the pre-acquisition and post-acquisition code generators 120 and 122, respectively, are compared by the dual channel logic circuit 128. If the address represented by the $AG_X$ signal is greater than or equal to the address represented by the $AG_Y$ signal, the dual channel four pulse coincidence or DCPC signal effects the generation of a LOAD signal by the post-acquition track circuit 126 and the $AG_X$ address signal from the pre-acquisition code generator 120 is loaded into the post-acquisition code generator 122. This resynchronizes the post-acquisition code generator 122 to the received video signal which is further along in the code sequence, i.e., was received first. Resynchronization ensures that the pulse train from the transmitting unit, i.e., the target designator, is being tracked and not a pulse train from a repeater type countermeasure.

For example, if the generated address $AG_X$ of the latest interpulse period recognized by the code correlator in the pre-acquisition search circuit 124 is greater than the address $AG_Y$ of the latest interpulse period generated by the post-acquisiton code generator 122, this discrepancy between addresses indicates that the code is being delayed and retransmitted by a repeater type countermeasure. The dual channel pulse coincidence or DCPC signal effects the loading of the $AG_X$ signal into the post-acquisition code generator 122 to thereby synchronize the post-acquisition code generator to the designator signal rather than the repeater signal. Thereafter, the dual channel logic circuit 128 is inhibited from resynchronizing the post-acquisition code generator, as long as the track mode is maintained.

As was previously mentioned, the pre-acquisition search circuit 124 of FIG. 3 includes a digital correlator which detects the receipt of the proper PIM code. With reference now to FIG. 4 where the pre-acquisition search circuit of FIG. 3 is described in greater detail, the video input signal VID from the receiver 34 of FIG. 1 is applied to the J input terminal of a video sync flip-flop 134. The output signal from the true output terminal Q of the flip-flop 134 is applied as the ADTA signal to the dual channel logic circuit 128 of FIG. 3. The output signal from the false output terminal $\overline{Q}$ is applied as the $\overline{ADTA}$ signal to the A register of a digital correlator 136. The 10 KHz clock signal $CL_{10}$ from the clock generator 130 of FIG. 3 is applied to the K input terminal of the flip-flop 134. This $CL_{10}$ signal is also applied directly to the $\phi 1A$ input terminal and is delayed in a conventional delay circuit 138 and applied to a $\phi 2A$ input terminal of the digital correlator 136. The locally generated pre-acquisition code signal PRCODE from the pre-acquisition code generator 120 of FIG. 3 is applied to the B register input terminal of the digital correlator 136.

The digital correlator 136 also receives clocking signals $BCL_1$ and $BCL_2$ from a pre-acquisition clock logic circuit 146 at the respective input terminals $\phi 1B$ and $\phi 2B$, and the interval correlate output signal ICOR from the digital correlator 136 is applied to a 3 of 4 decoder 140. The 3 pulse coincidence or 3 PC output signal from the 3 of 4 decoder 140 is applied to a delay compensation circuit 142 and the $CL_{10}$ clock signal is applied to both the delay compensation circuit 142 and to a frequency select circuit 144.

The frequency select circuit 144 supplies frequency select signals FS1 and FS2, respectively, to a pre-acquisition gate generator 148 and the FS1 signal may be supplied to the pre-acquisition clock logic circuit 146. The delay compensation circuit 142 provides the inhibit signal INH both to the pre-acquisition clock logic circuit 146 and the frequency select circuit 144 and supplies the delayed three pulse coincidence signal 3 PCD to a stop scan function circuit 150.

The pre-acquisition clock logic circuit 146 also receives the 10 KHz clock signal $CL_{10}$ from the clock generator 130 of FIG. 3. In addition, this circuit also receives the 2.56 MHz clock signal $CL_{2.56}$ and the 5.12 MHz clock signal $CL_{5.12}$ from the clock generator 130. The $CL_{2.56}$ clock signal is also applied to the clock input terminal C of the video sync flip-flop 134, to the stop scan function circuit 150 and to the delay compensation circuit 142. The pre-acquisition clock logic circuit 146 provides the pre-acquisition clock signal CLPR to the pre-acquisition code generator 120 of FIG. 3.

The track signal TACQ from the post-acquisition track circuit of FIG. 3 is applied to the stop scan function circuit 150 together with the timing signal $POG_{100}$. The stop scan function circuit 150 also receives a gating signal PRGA from the pre-acquisition gate generator 148 and provides the stop scan output signal STSCN.

The pre-acquisition compare signal PRCOMP from the pre-acquisition code generator 120 of FIG. 3 and the $CL_{10}$ clock signal from the clock generator 130 of FIG. 3 are applied to the pre-acquisition gate generator 148 to produce the gating signals PRGA, PRGTE and $PRG_{100}$. As earlier explained, the PRGA signal is applied to the stop scan function circuit 150. The PRGTE signal is applied to the dual channel logic circuit of FIG. 3 as well as to the frequency select circuit 144, and the $PRG_{100}$ output signal is applied to the post-acquisition track circuit of FIG. 3.

In operation and with continued reference to FIG. 4, the pre-acquisition search circuit 124 basically searches the incoming video signal VID for the presence of unique interval pairs which correspond to the interval piars of the code sequence PRCODE generated locally by the pre-acquisition code generator 120 described in detail in the referenced Bayston et al patent application.

The video signal VID is first shaped by the video sync circuit 134 since, in a typical system, the video signal may be very narrow and may thus be lost if directly clocked into the digital correlator 136. The synchronized video signal ADTA is then clocked into the digital correlator at approximately its average repetition rate, i.e., 10 KHz, while the locally generated code sequence PRCODE is clocked into the B register of the digital correlator 136.

In pre-acquisition mode, the PRCODE signal is clocked into the digital correlator at a 2.56 MHz rate so that any interval pair in the A register is compared with every interval pair in the locally generated code in the B register as will hereinafter be described in detail.

The 3 of 4 decoder 140 monitors the ICOR signal which indicates the results of the comparisons in the digital correlator, and the decoder 140 provides an output pulse 3 PC which indicates 3 pulse coincidence. Three pulse coincidence indicates favorable correlation of a unique interval pair of the incoming video signal with a unique interval piar in the locally generated code sequence as will hereinafter become apparent in connection with the description of the digital correlator 136.

When three pulse coincidence is detected, the delay compensation circuit generates an inhibit signal which causes the frequency select circuit 144 to change the B register clock rate from 2.56 MHz to 10 KHz. In addition, the inhibit signal INH from the delay compensation circuit inhibits the application of clock signals to the B register of the digital correlator for a predetermined number of clock intervals to allow the video signal in the A shift register to be shifted once again into coincidence with the signal in the B shift register. This loss of coincidence after detection of 3 pulse coincidence ordinarily occurs because of delays in the 3 of 4 decoder and the frequency select circuit and may require, for example, that the B register clock signal be inhibited for 3 clock intervals.

The frequency select signal FS1 from the frequency select circuit 144 also changes the rate of the clock signal DLPR from the pre-acquisition clock logic circuit 146 in response to the detection of three pulse coincidence from the 2.56 MHz rate to the 10 KHz. This change in the clock rate of the CLPR clock signal thereafter causes the pre-acquisition code generator 120 to generate the PRCODE signal at the lower 10 KHz rate.

The three pulse coincidence signal indicating the recognition of the desired code sequence in the incoming VID signal is delayed by the delay compensation circuit 142 and is utilized to enable the stop scan function circuit 150. Thereafter, the pre-acquisition gate generator 148 predicts the position of the next pulse in the incoming video signal in response to the pre-acquisition compare or PRCOMP signal and generates a pair of 100 microsecond gates $PRG_{100}$ and PRGTE. The PRGTE signal is utilized by the dual channel logic circuit 128 of FIG. 3 to ensure that the correlated incoming video signal is that of the target designator and not that of a repeater or other delay type countermeasure and to gate through a fourth code pulse if it is in fact present in the incoming video signal. As is described in greater detail in the referenced Bayston et al application, if this fourth pulse is present the track acquisition signal TACQ indicates its presence and the pre-acquisition search circuit reverts to pre-acquisition or search mode and the video signal VID is thereafter gated through the post-acquisition track circuit 126 of FIG. 3 as the gated video or GVID signal for use by a suitable control unit for tracking or guidance purposes.

Digital Correlator

A preferred embodiment of the digital correlator 136 of FIG. 4 is illustrated in greater detail in the functional block diagram of FIG. 5.

With reference now to FIG. 5, the 10 KHz clock signal $CL_{10}$ may be applied to the $\phi 1A$ input terminal of the digital correlator 136 and a slightly delayed version of the $CL_{10}$ clock signal may be applied to the $\phi 2A$ input terminal of the correlator 136. The synchronized data signal $\overline{ADTA}$ from the video sync flip-flop 134 of FIG. 4 may be applied to a 3,400 bit shift register generally indicated at 175 (hereinafter referred to as register A) via the input terminal A of the digital correlator 136.

The B register phase 1 clock signal BCL1 may be applied from the pre-acquisition clock logic circuit 146 of FIG. 4 to the $\phi 1B$ input terminal of the digital correlator 136. The B register phase 2 clock signal BCL2 may be applied to the $\phi 2B$ input terminal of the digital correlator 136. The generated pre-acquisisition code or PRCODE signal from the pre-acquisition code generator 120 of FIG. 3 may be applied to the data input data input terminal of a 3,400 bit shift register generally indicated at 176 (hereinafter referred to as register B) via the B input terminal of the digital correlator 136.

The output signal from the true output terminals of each of the stages of register A 175 may be compared with the output signals from the true output terminals of the corresponding stages of the register B 176 by 3,400 two input terminal AND gates generally indicated at 177. The output signals from the first 850 AND gates 177 may be applied through an OR gate 178 to output terminal A of the digital correlator 136 as one portion of the collectively illustrated interval correlation or ICOR output signal from the digital correlator 136. The output signals from the next two groups of register comparison AND gates 177 (AND gates 851–1,700 and 1,701–2,550, not illustrated) may likewise be applied in groups of 850 through respective OR gates to provide the B and C portions of the interval correlation signal ICOR at the collectively illustrated output terminal of the digital correlator. The output signals from the last group of 850 register comparison AND gates 177 (the 3,400th AND gate of which is illustrated) may likewise be applied through an OR gate indicated at 179 as the D portion of the ICOR signal.

In operation, the synchronized incoming video signal $\overline{ADTA}$ is shifted into register A at a 10 KHz clock rate. The locally generated code sequence PRCODE is, during pre-acquisition mode operation, shifted into the register B at a 2.56 MHz rate by the BCL1 and BCL2 signals which are synchronized with the $CL_{10}$ signal. Register A is of sufficient length that at least one complete interval pair (i.e., three successive pulses) and preferably two complete interval pairs (i.e., four successive pulses) of the incoming video signal can be stored in register A. As was previously described, the locally generated code sequence PRCODE is time compressed by a factor of 256 in pre-acquisition mode operation and is thus shifted into register B at 256 times the rate at which the incoming video signal is shifted into register A. It can thus be seen that the incoming video signal in register A remains stationary while the locally generated code sequence PRCODE is shifted 256 times. The incoming video signal is then shifted once and the locally generated code sequence PRCODE is again shifted through 256 stages of the B register. The incoming video signal in register A is thus relatively stationary in comparison to the locally generated code PRCODE which circulates rapidly through register B.

The contents of register A and register B are continuously compared by the AND gates 177 and a favorable comparison in any group of 850 AND gates provides a high signal level A, B, C or D portion of the interval correlate signal ICOR. If the 3 of 4 decoder 140 illustrated in FIG. 4 and described in greater detail in the reference Bayston et al application detects that three of the four ICOR signals are simultaneously at a high signal level, this indicates that an interval pair of the incoming video signal matches an interval pair of the locally generated PRCODE signal. In such an event, the three pulse coincidence signal 3 PC generated by the 3 of 4 decoder 140 of FIG. 3 conditions the decoder 140 to change to post-acquisition mode operation and then, upon recognition of another correct interpulse interval, into dual channel mode operation as was previously described in connection with FIGS. 3 and 4.

To facilitate an understanding of the digital correlator 136, reference may be had to FIGS. 6a–6c wherein a typical operation of the A and B registers is illustrated. For example, FIG. 6a graphically illustrates that at some time $T_1$ arbitrarily designated as time zero, register A contains a unique interval pair $I_1I_2$ and this unique interval pair corresponds to an interval pair in the locally generated code sequence being shifted into register B.

At some later time $T_2$ equal to 10 B register clock pulses BCL after $T_1$ (FIG. 6b), the contents of register B has been shifted ten stages to the right while the contents of register A has remained stationary. However, at time $T_2$ there is still no three pulse coincidence between the contents of registers A and B.

In FIG. 6c it can be seen that at some time $T_3$ after ten more B clock pulses BCL the pulses defining the interval pair $I_1I_2$ in register A are stored in the same stages as the pulses defining the interval pair $I_1I_2$ in the locally generated code stored in the register B. Thus, at time $T_3$ three pulse coincidences are detected, indicating that an interval pair of the incoming video signal matches an interval pair in the locally generated code. The decoder 36 of FIG. 1 may thereafter be synchronized with the incoming video signal VID and the incoming video signal gated through the decoder 36 to a utilization device by a gate signal generated in response to the post-acquisition code generator 122 compare signal POCOMP as was previously described.

It can be seen from the above description that the correlation of the incoming video signal with the locally generated code is accomplished on a continuing, dynamic basis, i.e., the signals applied to both the A and B registers are continuously being shifted but at different rates. In the preferred embodiment of the present invention, the length of each register is approximately 3,400 stages and the clock frequencies are selected so that one entire correlation search cycle can be completed within the nominal time interval between successive pulses of a valid code sequence as the code sequence is shifted through register A.

For example, at a 10 KHz clock rate, a pulse in register A is shifted from the first stage through the 850th shift register stage in 85 milliseconds. In the same time interval, an entire cycle of the locally generated code PRCODE (i.e., 254 pulses) is shifted through the first 850 stages of register B since the clock rate of register B exceeds the clock rate of register A by a factor (256) at least substantially equal to, and preferably slightly greater than, the number of pulses in one code cycle (i.e., 254). Thus, every interpulse interval of the locally generated code is compared with the received code at least once as the received and locally generated codes are shifted through the four 850 stage sections of the respective registers A and B.

Moreover, in the preferred embodiment of the invention the minimum spacing between successive pulses of a valid code sequence is, at the 10 KHz clock rate, approximately 873 clock pulses or 87.3 milliseconds. These codes pulses are shifted into the shift register A at a 10 KHz clock rate and thus only one valid code pulse can be present in a correlator section of 850 register A stages. This can be more clearly seen by calculating, as follows, the maximum time interval Tmax by which two pulses may be spaced and still remain in the same 850 stage section of the register:

$$Tmax = (N)(1/f)$$

where N equals the number of stages in the correlator section and f equals the frequency of the clock signal applied to the register. Thus, in the preferred embodiment of the invention, $$Tmax = (850)(1/10^4) = 85 \text{ milliseconds.}$$

From the above it can be seen that due to the minimum spacing of 87.3 milliseconds between code pulses, no two valid pulses of the code can be simultaneously in one 850 stage section of the digital correlator 136. Stated another way, only one valid code pulse may be in a register section or group of consecutive stages as long as the number of consecutive stages in the group is less than the product of the minimum interpulse period Tmin of the code (e.g., 87.3 milliseconds) and the frequency f of the clock signal applied to the register, i.e., N (Tmin)(f). With this arrangement, a single output signal (designated A, B, C and D in FIG. 5) indicating pulse coincidence between any two corresponding stages in an 850 stage section may thus be provided from each of the four correlator sections. When three out of four of the output signals from the four correlator sections assume a high signal level, code correlation may be indicated as was previously described.

The two 3,400 stage shift registers 175 and 176 (register A and register B of FIG. 5) are preferably of the dynamic, two phase type commonly used in monolithic field effect transistor (FET) shift register circuits employed in large scale integration metal-oxide-semiconductor (MOS) technology. The AND gate 177 and the OR gates 178, 179, shown in FIG. 5, are also preferably of a type commonly used in monolithic FET circuitry. The OR gates such as 178 and 179 may actually be constructed as an OR gates "tree" for convenience to avoid an unwieldy large number of inputs at a single collection point. The OR gate tree may be arranged so that sections of the partitioned circuit can be combined into the basic four sections of 850 (or very nearly 850) stages per section. This permits the integration of the entire digital correlator 136 of FIG. 5 by integrated circuit techniques.

Since the A and B registers must shift in synchronism when they are simultaneously shifted, the register A clock pulses may be derived from the register B clock pulses by counting down from the B clock or essentially selecting each 256th pair of the two phase B clock pulses for the two phase A clock signals. This may be accomplished in any suitable conventional manner by the clock generator 130 of FIG. 3.

Although in the preferred embodiment register A operates at a 10 KHz rate, only 1/256 as fast as register B which operates at a 2.56 MHz rate, register A must shift as fast as and in synchronism with register B when register A is require to shift. Because of this requirement, register A has the inherent capability of also operating at clock speeds of up to 2.56 MHz and it is convenient to make registers A and B identical, i.e., both capable of operating at either 10 KHz or 2.56 MHz. It should be noted, however, that it is not essential that register B be capable of operating as slowly as register A.

For economic reasons (to achieve a high yield of acceptable circuits in the manufacturing process) it is convenient to partition the digital correlator 136 into a number of identical parts or sections which can be connected together in series to make a complete digital correlator. Several such arrangements are possible. The basic partitioning arrangement is to divide it into four sections of 850 stages each since, as was previously described, each of the four groups of 850 stages represents one detector or correlator. Other possible arrangements are eight sections of 425 stages each further combined into four sections, or 16 sections of 212 each further combined into four sections of 848 each for a total length of 3,392 stages (a sufficiently close approximation to the desirable number of 3,400 stages), or, as a final example, 20 sections of 170 stages each combined in groups of 5 to provide the basic four sections of 850 stages each.

A preferred embodiment of the physical layout of the digital correlator of the present invention is illustrated in the plan view of FIG. 7. Referring now to FIG. 7, the digital correlator 136 is preferably constructed from 16 identical MOS integrated circuit chips 200 mounted on a ceramic base 202. The chips 200 may be connected as is hereinafter described to form four groups of chips ($A_1-A_4$, $B_1-B_4$, $C_1-C_4$ and $D_1-D_4$), each group forming an 848 stage dual register correlator section with signals being applied to and coupled from the correlator via input and output terminals generally indicated at 204 and 206, respectively.

Each integrated circuit chip 200 preferably includes two serial shift registers of two hundred and twelve (212) stages each, two hundred and twelve (212) AND gates for comparing the bits in corresponding stages of the two registers, and an OR gate "tree" for collecting the output signals from the AND gates. At least one and preferably three external input terminals are provided to the OR gate "tree" on each chip 200 so that the output signals from the OR gates on the chips may be combined as is hereinafter described.

Each of the two 212 stage registers on each chip forms a portion of the respective registers A and B previously described in connection with FIG. 5. All of the register A portions of 212 stages on each chip 200 are connected in series to form a 3,392 stage serial shift register A and the register B portions on each chip 200 are similarly connected together to form a 3,392 stage serial shift register B. The output signals from the OR gate "trees" on each group of four chips 200 are preferably combined in one of the four chips 200 (e.g., the first or fourth chip of the group) to provide each of the output signals A, B, C and D from the four 850 stage (848 in this embodiment) correlator sections.

The arrangement illustrated in FIG. 7 provides a very small (approximately 1½" square), reliable integrated package with inconsequential cross coupling between clock and code input signals. The 16 chips 200 may be coupled on the ceramic base 202 via a pattern of strip conductors 208 formed on the ceramic base 202 by conventional etching techniques or in any other suitable manner.

The present invention may be embodied in other specific forms without departing from the spirit or essential characteristics thereof. For example, the specific number of stages of each shift register and each group of consecutive stages may be varied to suit the clock frequency, minimum code pulse spacing and other factors by which the size of the digital correlator may be determined as was previously discussed. Moreover, the total number of groups of consecutive stages required to detect a predetermined spacing between two pulses need only be two in number, depending upon the code employed, although more reliable results may be obtained with three or, as disclosed, four groups of consecutive shift register stages.

Similarly, the integrated circuit of FIG. 7 may be divided into a plurality of chips less than 16 in number to suitably define the groups of consecutive stages required for decoding a particular signal. For example, where three pulse coincidence (two pulse intervals) is to be detected, three chips or any multiple of three chips may be utilized.

The presently disclosed embodiment is therefore to be considered in all respects as illustrative and not restrictive, the scope of the invention being indicated by the appended claims rather than by the foregoing description, and all changes which come within the meaning and range of equivalency of the claims are therfore intended to be embraced therein.

What is claimed is:

1. A wave energy decoding system comprising:
   means for receiving pulses of wave energy including pulses spaced in accordance with a pseudo-random, cyclically repetitive code, the spacing of the pulses of said code defining a plurality of sequential pairs of time intervals, each pair of time intervals being unique within one cycle of said code;
   a first plural stage shift register;
   means responsive to said pulse receiving means for clocking received pulses into said first shift register at a first predetermined rate;
   means for generating a series of pulses defining said pseudo-random, cyclically repetitive code;
   a second plural stage shift register;
   means responsive to said pulse generating means for clocking generated pulses into said second shift register at a second predetermined rate higher than said first predetermined rate;
   means for comparing the signal levels of corresponding stages of said first and second shift registers; and,
   means responsive to said comparison means for generating a specific signal.

2. The system of claim 1 wherein said specific signal generating means is responsive to a predetermined comparison of at least three corresponding stages of said first and second shift registers.

3. The system of claim 2 wherein said second rate exceeds said first rate by a factor at least substantially equal to the number of pulses in one cycle of said code.

4. The system of claim 3 wherein the number of said plural stages of each of the shift registers is equal and is less than four times the product of the minimum interpulse period of the pulses of said code and said first rate.

5. The system of claim 1 wherein said second rate exceeds said first rate by a factor at least substantially equal to the number of pulses in one cycle of said code.

6. The system of claim 5 wherein the number of plural stages in each of said shift registers is equal and is less than four times the product of the minimum interpulse period of the pulses of said code and said first rate.

7. The system of claim 1 wherein the number of plural stages of each of said shift registers is equal and is less than four times the product of the minimum interpulse period of the pulses of said code and said first rate.

8. The system of claim 7 wherein said specific signal generating means is responsive to a predetermined comparison of at least three corresponding stages of said first and second shift registers.

9. A decoder for a pulse signal comprising:
   means for receiving a pulse signal encoded in accordance with a selected code as ordered, uniquely spaced pulses;
   means for generating a pulse signal encoded in accordance with the selected code as ordered, uniquely spaced pulses wherein the unique spacing of the pulses in the generated signal is related to the unique spacing of the pulses of the received pulse signal;
   a first shift register;
   means for shifting the received pulse signal into said first shift register at a first predetermined rate;
   a second shift register;
   means for shifting said generated pulse signal into said second shift register at a second predetermined rate higher than said first predetermined shift rate;
   means for comparing the binary signal levels of corresponding stages of said first and second shift registers; and,
   means for generating a specific signal in response to a favorable comparison of the signal levels of at least three corresponding stages of said first and second shift registers.

10. The decoder of claim 9 wherein the unique spacing of the pulses of the received and the generated pulse signal is formed by spacing successive pairs of pulses of the pulse signals in accordance with unique combinations of time intervals.

11. The decoder of claim 10 wherein said specific signal is generated in response to a favorable comparison of at least one unique interpulse interval pair in said received and generated pulse signals.

12. A code correlation system for detecting correlation between an incoming series of pulses containing pulses spaced in accordance with a predetermined code and a locally generated series of pulses spaced in accordance with the predetermined code, the system comprising:
   a first serial shift register having a predetermined number of stages;
   a second serial shift register having a like predetermined number of stages;

first means for generating a first output signal in response to a desired signal level correlation between any two corresponding stages of a first group of consecutive stages of each of said shift registers; and, second means for generating a second output signal in response to a desired signal level correlation between any two corresponding stages of a second group of consecutive stages of each of said shift registers, said first and second groups of said stages each including a like plurality of said first and second shift register stages.

13. The system of claim 12 wherein said predetermined code repeats cyclically; and including:

means for shifting the incoming series of pulses into one of said shift registers at a first predetermined rate; and, means for shifting the locally generated series of pulses into the other of said shift registers at a second predetermined rate, said second rate exceeding said first rate by a factor at least substantially equal to the number of pulses in one cycle of said code.

14. The system of claim 13 wherein the number of said stages of said registers in each of said first and second groups of consecutive stages is less than the product of the minimum interpulse period of the pulses of said code and said first predetermined rate.

15. The system of claim 12 including:

third means for generating a third output signal in response to a desired signal level correlation between corresponding stages of a third group of consecutive stages of each of said shift registers; and, fourth means for generating a fourth output signal in response to a desired signal level correlation between any two corresponding stages of a fourth group of consecutive stages of each of said shift registers, the number of stages in said third and fourth groups of stages being equal to the number of stages in said first and second groups of stages.

16. The system of claim 15 wherein said predetermined code repeats cyclically; and including:

means for shifting the incoming series of pulses into one of said shift registers at a first predetermined rate; and, means for shifting the locally generated series of pulses into the other of said shift registers at a second predetermined rate, said second rate exceeding said first rate by a factor at least substantially equal in number of pulses in one cycle of the code.

17. The system of claim 16 wherein the number of stages of said registers in each of said first, second, third and fourth groups of consecutive stages is less than the product of the minimum interpulse period of the pulses of said code and said first predetermined rate.

18. A digital code correlator comprising:

a plurality of integrated circuit chips, each including:

two serial shift registers each having a like predetermined number of stages;

a plurality of logic gates equal in number to said predetermined number of stages and operatively connected to corresponding stages of said two shift registers to compare the signal levels of said corresponding stages, each of said logic gates being operable to generate a first output signal level in response to a favorable comparison of the signal levels of said corresponding stages; and, logic means for generating a second output signal level in response to the generation of said first output signal level by any of said logic gates;

an insulative carrier, said plurality of integrated circuit chips being mounted on said carrier;

circuit means on said carrier for serially connecting corresponding serial shift registers on said chips to form first and second serial shift registers each having a like number of stages equal to the product of said predetermined number and the number of chips on said carrier;

circuit means on said carrier for applying first and second input signals to said first and second serial shift registers, respectively, on a first one of said plurality of chips; and, circuit means on said carrier for providing said second output signal level from said logic means on at least some of said plurality of chips at respective output terminals.

19. The code correlator of claim 18 wherein said plurality of integrated chips includes at least three chips, said second output signal level from each of said three chips being provided at respective output terminals.

20. The code correlator of claim 18 wherein said plurality of integrated chips includes sixteen chips, the combined second output signal levels from serially connected, consecutive groups of four chips being provided at four output terminals, respectively.

21. A method for decoding a received pulse signal encoded in accordance with a selected code as ordered, uniquely spaced pulses comprising the steps of:

generating a pulse signal encoded in accordance with the selected code as ordered, uniquely spaced pulses wherein the unique spacing of the pulses in the generated signal is related to the unique spacing of the pulses of the received pulse signal;

shifting the received pulse signal into a first shift register at a first predetermined rate;

shifting said generated pulse signal into a second shift register at a second predetermined rate higher than said first predetermined shift rate;

comparing the binary signal levels of corresponding stages of the first and second shift registers; and, generating a specific signal in response to a favorable comparison of the signal levels of a predetermined plural number of corresponding stages of the first and second shift registers.

22. The method of claim 21 wherein the specific signal is generated in response to a favorable comparison of the signal levels of three corresponding stages of the shift registers.

23. The method of claim 22 wherein the predetermined code repeats cyclically and wherein the second predetermined rate exceeds the first predetermined rate by a factor at least substantially equal to the number of pulses in one cycle of the code.

24. A method of claim 21 wherein the unique spacing of the pulses of the received and generated pulse signals is formed by spacing successive pairs of pulses of the pulse signals in accordance with unique combinations of time intervals.

25. The method of claim 24 wherein the specific signal is generated in response to a favorable comparison of at least one unique pair of time intervals in the received and generated pulse signals.

26. A method for detecting correlation between an incoming series of pulses containing pulses spaced in accordance with a predetermined code and a locally generated series of pulses spaced in accordance with the predetermined code, the method comprising the steps of:

shifting the incoming series of pulses into a first serial shift register having a predetermined number of stages;

shifting the locally generated series of pulses into a second serial shift register having a like predetermined number of stages;

generating a first output signal in response to a desired signal level correlation between any two corresponding stages of a first group of consecutive stages of each of said shift registers; and, generating a second output signal in response to a desired signal level correlation between any two corresponding stages of a second group of said stages of each of said shift registers, said first and second groups of said stages each including a like plurality of said first and second shift register stages.

27. The method of claim 26 wherein the predetermined code repeats cyclically and including the steps of:

shifting the incoming series of pulses into one of the shift registers at a first predetermined rate; and, shifting the locally generated series of pulses into the other of the shift registers at a second predetermined rate, the second rate exceeding the first rate by a factor at least substantially equal to the number of pulses in one cycle of the code.

28. The method of claim 26 including the steps of:

generating a third output signal in response to a desired signal level correlation between corresponding stages of a third serially connected group of consecutive stages of each of said shift registers; and, generating a fourth output signal in response to a desired signal level correlation between any two corresponding stages of a fourth group of consecutive stages of each of said shift registers, said third and fourth groups of said stages each including a plurality of said first and second shift register stages equal in number to said first and second groups of stages.

29. The method of claim 28 wherein the predetermined code repeats cyclically and including the steps of:

shifting the incoming series of pulses into one of the shift registers at a first predetermined rate; and, shifting the locally generated series of pulses into the other of the shift registers at a second predetermined rate, the second rate exceeding the first rate by a factor at least substantially equal to the number of pulses in one cycle of the code.

* * * * *